(12) United States Patent
Cho

(10) Patent No.: US 7,684,240 B2
(45) Date of Patent: Mar. 23, 2010

(54) FLASH MEMORY DEVICE HAVING BIT LINES DECODED IN IRREGULAR SEQUENCE

(75) Inventor: Ji-Ho Cho, Gyeonggi-do (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 417 days.

(21) Appl. No.: 11/670,367

(22) Filed: Feb. 1, 2007

(65) Prior Publication Data

US 2007/0177423 A1 Aug. 2, 2007

(30) Foreign Application Priority Data

Feb. 1, 2006 (KR) .................. 10-2006-0009785

(51) Int. Cl.
*G11C 16/04* (2006.01)
(52) U.S. Cl. .................. 365/185.05; 365/185.06; 365/185.11; 365/185.17
(58) Field of Classification Search ............ 365/185.02, 365/185.11, 185.17, 185.13, 185.05, 185.06
See application file for complete search history.

(56) References Cited

U.S. PATENT DOCUMENTS

| 5,278,961 | A | 1/1994 | Mueller | |
| 6,362,661 | B1 * | 3/2002 | Park | 327/53 |
| 6,400,606 | B1 * | 6/2002 | Cho | 365/185.2 |
| 6,507,534 | B2 * | 1/2003 | Balluchi | 365/230.06 |
| 6,813,175 | B2 | 11/2004 | Ahn et al. | |
| 6,850,438 | B2 | 2/2005 | Lee et al. | |
| 6,958,949 | B2 * | 10/2005 | Confalonieri et al. | 365/230.06 |
| 7,042,795 | B2 * | 5/2006 | Lee et al. | 365/230.06 |
| 7,190,630 | B2 * | 3/2007 | Shimbayashi | 365/230.05 |
| 7,352,645 | B2 * | 4/2008 | Sforzin et al. | 365/227 |
| 7,394,719 | B2 * | 7/2008 | Lee et al. | 365/230.06 |

FOREIGN PATENT DOCUMENTS

| JP | 2003-217289 | 7/2003 |
| JP | 2004-265566 | 2/2007 |
| KR | 10-2003-0026534 | 4/2003 |

* cited by examiner

*Primary Examiner*—Tuan T Nguyen
*Assistant Examiner*—Hien N Nguyen
(74) *Attorney, Agent, or Firm*—Myers Bigel Sibley & Sajovec, P.A.

(57) ABSTRACT

An embodiment of a flash memory device comprises a cell array including memory cells coupled to bit lines, a decoder configured to decode successive logical column addresses into physical column addresses that are arranged non-sequentially, and a gate circuit to partially select the bit lines in response to the decoded addresses. Physically adjacent bit lines may be activated so that electrical coupling effects are eliminated by non-successively activating the bit lines.

12 Claims, 3 Drawing Sheets

FLASH MEMORY DEVICE HAVING BIT LINES DECODED IN IRREGULAR SEQUENCE

CROSS-REFERENCE TO RELATED APPLICATIONS

This U.S. non-provisional patent application claims priority under 35 U.S.C. § 119 from Korean Patent Application No. 2006-09785 filed on Feb. 1, 2006, the entire contents of which are hereby incorporated by reference.

BACKGROUND

The present invention disclosed herein relates to flash memory devices, and more particularly to a flash memory device operable with decoding bit lines.

A flash memory device is generally constructed with an array of cells or memory transistors in a form similar to other memories. In particular, a flash memory has floating gates each of which is interposed between a control gate and a substrate in the structure of the memory transistors (or cells), offering non-volatility to the memory cells. As well known in the art of memory, the control gates of the memory cells arranged in rows are coupled to a series of word lines. The memory cells in each row are accessed by selecting a corresponding one of the word lines. Also, drain regions of memory cells arranged in columns are coupled to a series of bit lines. The memory cells in each column are accessed by selecting corresponding bit lines. The drain regions of the memory cells are connected with a common source line. In several kinds of flash memory devices, a memory cell array is divided into a plurality of sectors, which allows flexibility in programming and erasing operations.

Flash memories are generally differentiated into two types; NAND and NOR. A NAND-type flash memory is formed with a structure of strings in which pluralities of cell transistors are coupled to one bit line in series. In the cell transistor of the NAND flash memory, a data bit is stored or erased using the mechanism of Fowler-Nordheim (F-N) tunneling. A NOR flash memory is formed of pluralities of cell transistors that are coupled to one bit line in parallel. In the NOR flash memory, a data bit is stored using the mechanism of channel hot electron injection and erased in the F-N tunneling mode.

In general, because a NAND flash memory consumes a smaller current than a NOR flash memory it is better suited to high integration density. On the other hand, a NOR flash memory is relatively compatible with high frequency operation.

In programming a NOR flash memory cell, predetermined program voltages (e.g., 10V and 5~6V) are applied to the control gate and the drain region of the memory cell while the source region is grounded. The voltages applied to the control gate and drain region induce hot electrons. The hot electrons are accumulated in the floating gate, which forces the floating gate to be charged to a negative potential, increasing a threshold voltage of the memory cell. This mechanism of electron transmission is called channel hot electron (CHE) injection.

A flash memory device is erased in units called sectors. Erasing a sector as a whole is accomplished by means of the F-N tunneling mode. According to the F-N tunneling mode, a high negative voltage of about −10V is applied to the control gate and a positive voltage of 6~9V is applied to the semiconductor substrate. The source and drain regions are maintained in a floating state. With this bias condition, a strong electric field of 6~7 MV/cm is formed between the control gate and the semiconductor substrate, inducing the F-N tunneling. By the F-N tunneling operation, the negative charges accumulated in the floating gate are released to lower the threshold voltage of the flash memory cell.

The memory cells are read by applying predetermined voltages (e.g., 4.5V and 1V) to the control gate and the drain region while grounding the source region. A current or voltage on a bit line is detected by means of a sense amplifier. If the memory cell is programmed, the threshold voltage is relatively high and its corresponding bit line voltage is relatively low. In this case, the channel region of the memory cell is not conductive, which is referred to as an 'off cell'. In contrast, if the memory cell is erased, the threshold voltage is relatively low and its corresponding bit line voltage is relatively high. In this case, the channel region of the memory cell is not conductive, which is referred to as an 'on cell'.

In general, the reading operation of the NOR flash memory device is carried out in a random access mode. The NOR flash memory device is also operable in a burst read mode (or synchronous read mode) that continuously reads data from the memory cells to offer a high-frequency reading operation. In the burst read mode, addresses may be generated in sequence in the memory device. Thus, there is no need for a user to provide all addresses. This function is useful when, at the same time, outputting all data of the memory device or data of memory cells belonging to a specific row is required.

However, since in the burst mode, adjacent bit lines are activated in sequence, coupling effects can easily be generated. These coupling effects can be generated even on global bit lines as well as local bit lines. The coupling effects between the bit lines decreases operating speeds during precharging bit lines and reading data, incurring malfunctions in the NOR flash memory device.

SUMMARY

Embodiments of the present invention are directed to solve the aforementioned problems, providing a flash memory device capable of preventing coupling effects between adjacent bit lines during a burst read mode.

Embodiments of the present invention are also directed to a flash memory device capable of enhancing speed and accuracy of operation in a burst read mode.

According to one aspect of the present invention, an embodiment of a flash memory device includes a cell array including pluralities of memory cells coupled to pluralities of bit lines, a decoder configured to decode logically successive column addresses into physically discontinuous column addresses, and a gate circuit to partially select the bit lines in response to the decoded column addresses from the decoder.

In some embodiments, the flash memory device may be a NOR flash memory device. Physically adjacent bit lines may be discontinuously selected during a burst read operation. The device may further include a second decoder configured to decode logically successive column addresses into physically discontinuous column addresses, and a second gate circuit to partially select the global bit lines in response to the decoded column addresses from the second decoder. The second gate circuit may couple the partially selected global bitlines to pluralities of data lines. Physically adjacent global bit lines may be discontinuously selected during a burst read operation.

According to another aspect of the present invention, in a flash memory device having bit lines coupled to the cells, an embodiment of a method includes generating selection signals in response to column addresses, and selecting the bit lines in response to the selection signals, wherein the selection signals are generated by decoding logically adjacent column addresses to select bit lines that are not physically adjacent.

In some embodiments, the method may further include coupling the selected bit lines to global bit lines in response to the selection signals. The method may also further include generating second selection signals in response to the column addresses, and selecting the global bit lines in response to the second selection signals, wherein the second selection signals are generated by decoding logically adjacent column addresses to select global bit lines that are not physically adjacent. The selected global bit lines may be coupled in response to the second selection signals. Physically adjacent bit lines may be discontinuously selected during a burst read operation.

According to another aspect of the present invention, in an embodiment of a flash memory device having a burst read mode wherein data is continuously read in response to addresses generated internally in sequence, the memory device may include a memory cell array having memory cells coupled to local bit lines, a gate circuit to couple the local bit lines to sense amplifiers in response to selection signals, and a column decoder to generate the selection signals in response to column addresses by decoding logically sequential column addresses into physical column addresses in an irregular sequence.

In some embodiments, the selection signals may include local selection signals and global selection signals, and the column decoder may include a local column decoder to generate the local selection signals, and a global column decoder to generate the global selection signals. The gate circuit may include a first gate block to couple selected ones of the local bit lines to global bit lines in response to the local selection signals, and a second gate block to couple selected ones of the global bit lines to the sense amplifiers in response to the global selection signals. Local portions of logically successive column addresses may be mapped to physically discontinuous local bit lines and/or global portions of logically successive column addresses may be mapped to physically discontinuous global bit lines. The memory cell array may be divided into sectors, and the gate circuit may includes a gate block having a plurality of gate circuits corresponding to the sectors of the memory cell array and arranged to operate in response to the selection signals. The memory cell may also be divided into sectors wherein the gate circuit includes a first gate block having a first plurality of gate circuits corresponding to the sectors of the memory cell array and arranged to operate in response to the local selection signals, and a second gate block having a second plurality of gate circuits corresponding to sectors of the memory cell array and arranged to operate in response to the global selection signals.

A further understanding of the nature and advantages of the present invention herein may be realized by reference to the remaining portions of the specification and the attached drawings.

BRIEF DESCRIPTION OF THE FIGURES

Non-limiting and non-exhaustive embodiments of the present invention will be described with reference to the following figures, wherein like reference numerals refer to like parts throughout the various figures unless otherwise specified. In the figures.

DETAILED DESCRIPTION

Preferred embodiments of the present invention will be described below in more detail with reference to the accompanying drawings. The present invention may, however, be embodied in different forms and should not be constructed as limited to the embodiments set forth herein. Rather, these embodiments are provided so that this disclosure will be thorough and complete, and will fully convey the scope of the present invention to those skilled in the art.

In embodiments illustrated herein, a flash memory device may be comprised of a cell array including pluralities of memory cells coupled to pluralities of bit lines, a decoding unit for decoding logical column addresses, which are successively introduced in correspondence with bit lines, into physically discontinuous column addresses, and a gate circuit for partially selecting the bit lines in response to results of the decoding operations.

In the following description, as an exemplary model for structural and functional features, embodiments will be described using an organization with a column decoder capable of preventing the coupling effects between adjacent bit lines in the flash memory device as a kind of nonvolatile memory device. But this description is illustrative of only a few embodiments, and other modifications are also available within the technical territory of the present invention.

Figure 1:
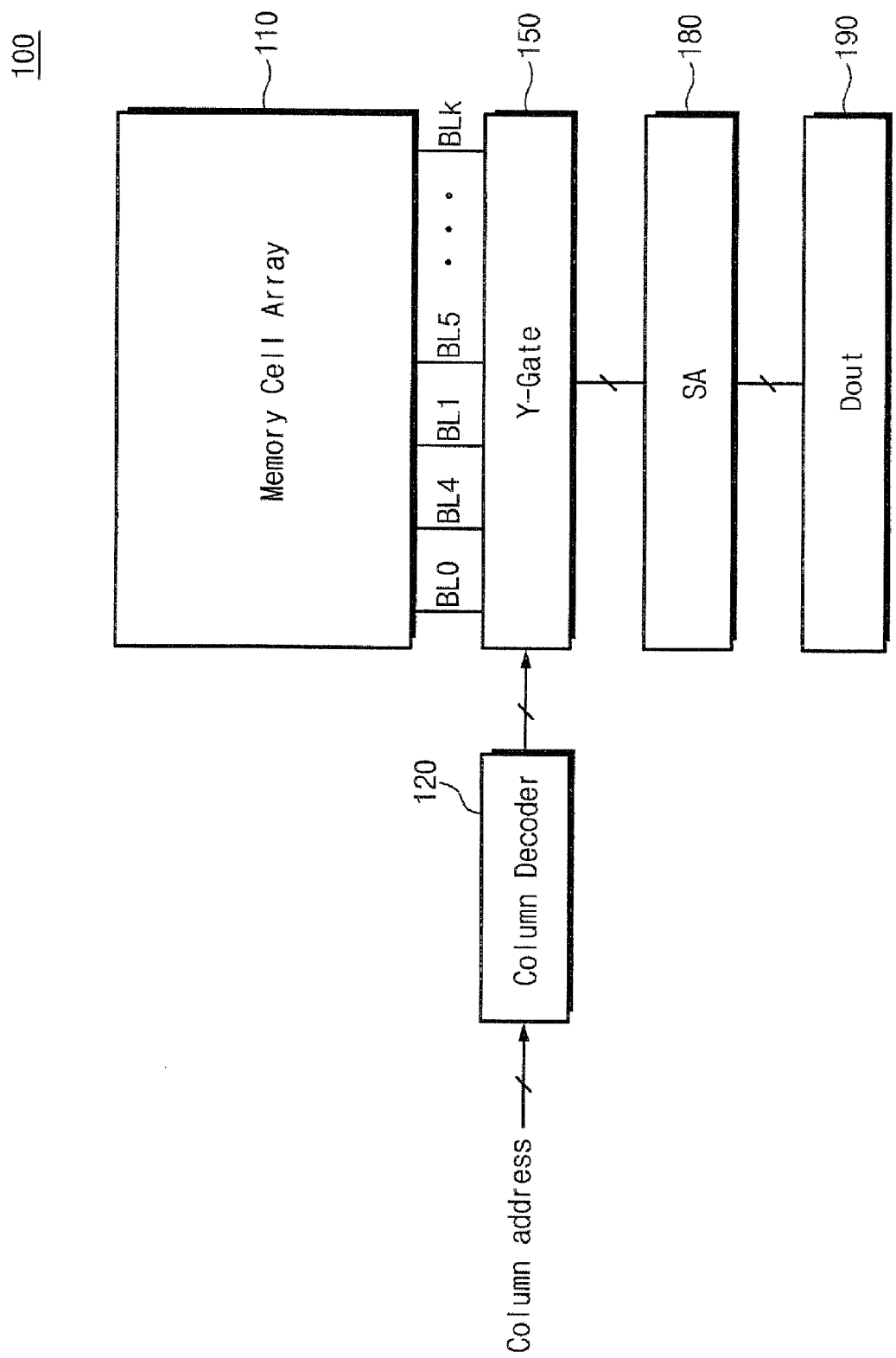
FIG. 1 is a block diagram illustrating an overall structure of a flash memory device in accordance with embodiments.

FIG. 1 is a block diagram illustrating an overall structure of a flash memory device 100 in accordance with an embodiment. FIG. 1 shows an organization of a NOR flash memory device as an example.

Referring to FIG. 1, the flash memory device 100 includes a memory cell array 110 for storing data. The memory cell array 110 includes bit lines BL0~BLk. Although not shown in FIG. 1, each bit line may be coupled to pluralities of nonvolatile memory cells. Each nonvolatile memory cell may be made up of a floating gate transistor well known in the art.

A column decoder 120 generates selection signals from decoding a column address. As will be described hereinafter, the column decoder 120 decodes a sequence of input column addresses (i.e., logical column addresses corresponding to bit lines) so that physical column addresses correspond non-sequentially with the bit lines. Reference signs BL0, BL4, BL1, BL5, . . . , and BLk shown in FIG. 1 denote the logical column addresses correspondent with the bit lines.

A gate circuit (Y-gate) 150 partially selects the bit lines BL0~BLk in response to selection signals generated from the column decoder 120. The selected bit lines may be connected to a sense amplifier circuit (SA) 180. The sense amplifier circuit 180 senses and amplifies data read out from the memory cells coupled to the selected bit lines. The sensed data are output through a data output circuit (Dout) 190. Here, the column decoder 120 and the gate circuit 150 form a column selection circuit for partially selecting the bit lines in response to the column addresses.

The flash memory device 100 according to an embodiment can conduct a successive burst read operation. During the burst read mode, an entire portion of data of the memory cell array or data of memory cells coupled to a specific word line are read out in sequence. Then the read data are output to a user during successive clock cycles. The column addresses used in the burst read operation are logically successive and sequential with each other. But the physical column addresses used in a practical read operation are non-sequentially generated, as shown in FIG. 1. In other words, although the bit lines are physically adjacent to each other, the logical column addresses corresponding to the adjacent bit lines are not adjacent to each other. Thus, because the bit lines physically adjacent to each other are not successively activated, there is no coupling effect between them during a burst read operation. This feature can be sufficiently achieved just by controlling the decoding pattern of the column decoder 120 without needing to alter hardware architecture or interconnections.

Figure 2:
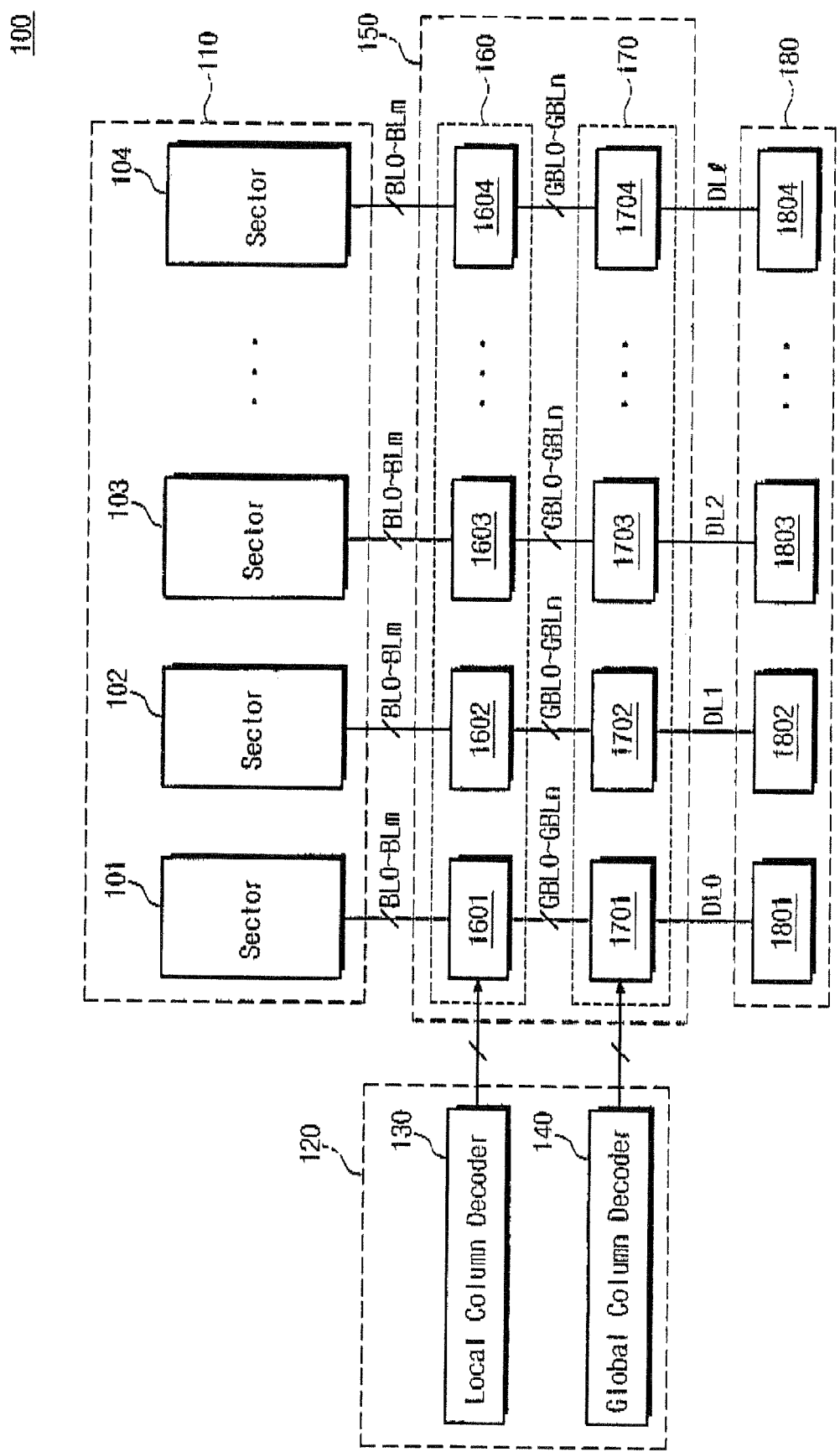
FIG. 2 is a detailed block diagram of an embodiment of the flash memory device shown in FIG. 1.

FIG. 2 is a detailed block diagram of the flash memory device 100 shown in FIG. 1, illustrating detailed organizations of the column decoder 120 and the gate circuit 150.

Referring to the embodiment of FIG. 2, the memory cell array 110 includes sectors 101~104. Each sector includes local bit lines BL0~BLm. Although not shown, the local bit lines BL0~BLm are coupled respectively to the plural nonvolatile memory cells. In the present embodiment, the nonvolatile memory cells may be formed of NOR flash memory cells.

The column decoder 120 is comprised of a local column decoder 130 and a global column decoder 140. The local column decoder 130 generates selection signals YA0~YA3 to designate the local bit lines BL0~BLm. The global column decoder 140 generates selection signals YB0~YB3 to designate the global bit lines GBL0~GBLn.

The gate circuit 150 is comprised of a first gate block 160 and a second gate block 170. The first gate block 160 selects the local bit lines BL0~BLm in response to the selection signals YA0~YA3 provided from the local column decoder 130. The first gate block 160 includes gate circuits 1601~1604 corresponding to the sectors 101~104. The gate circuits 1601~1604 operate in response to the local selection signals YA0~YA3 provided from the local column decoder 130. For instance, the gate circuit 1601 is connected to the local bit lines BL0~BLm of the sector 101 corresponding thereto, partially selecting the bit lines BL0~BLm in response to the selection signals YA0~YA3 provided from the local column decoder 130. The remaining gate circuits 1602~1604 operate in the same manner with the gate circuit 1601.

The second gate block 170 selects the global bit lines GBL0~GBLn in response to the selection signals YB0~YB3 provided from the global column decoder 140. The second gate block 170 includes gate circuits 1701~1704 corresponding to the gate circuits 1601~1604. The gate circuits 1701~1704 operate in response to the global selection signals YB0~YB3 provided from the global column decoder 140. For instance, the gate circuit 1701 is electrically connect the global bit lines GBL0~GBLn. One of the gate circuits 1701~1704 may be activated to correspondingly connect selected ones of the global bit lines GBL0~GBLn with the data lines DL0~DLn. For this selection, the gate circuit 150 may select one of the sectors 101~104 (sector selection function), i.e., a function for activating a selective one of the gate circuits 1701~1704. Data read from the selected local and global bit lines BL0~BLm and GBL0~GBLn are provided to sense amplifiers 1801~1804 corresponding to each sector. The sense amplifiers 1801~1804 detect and amplify their input data.

Figure 3:
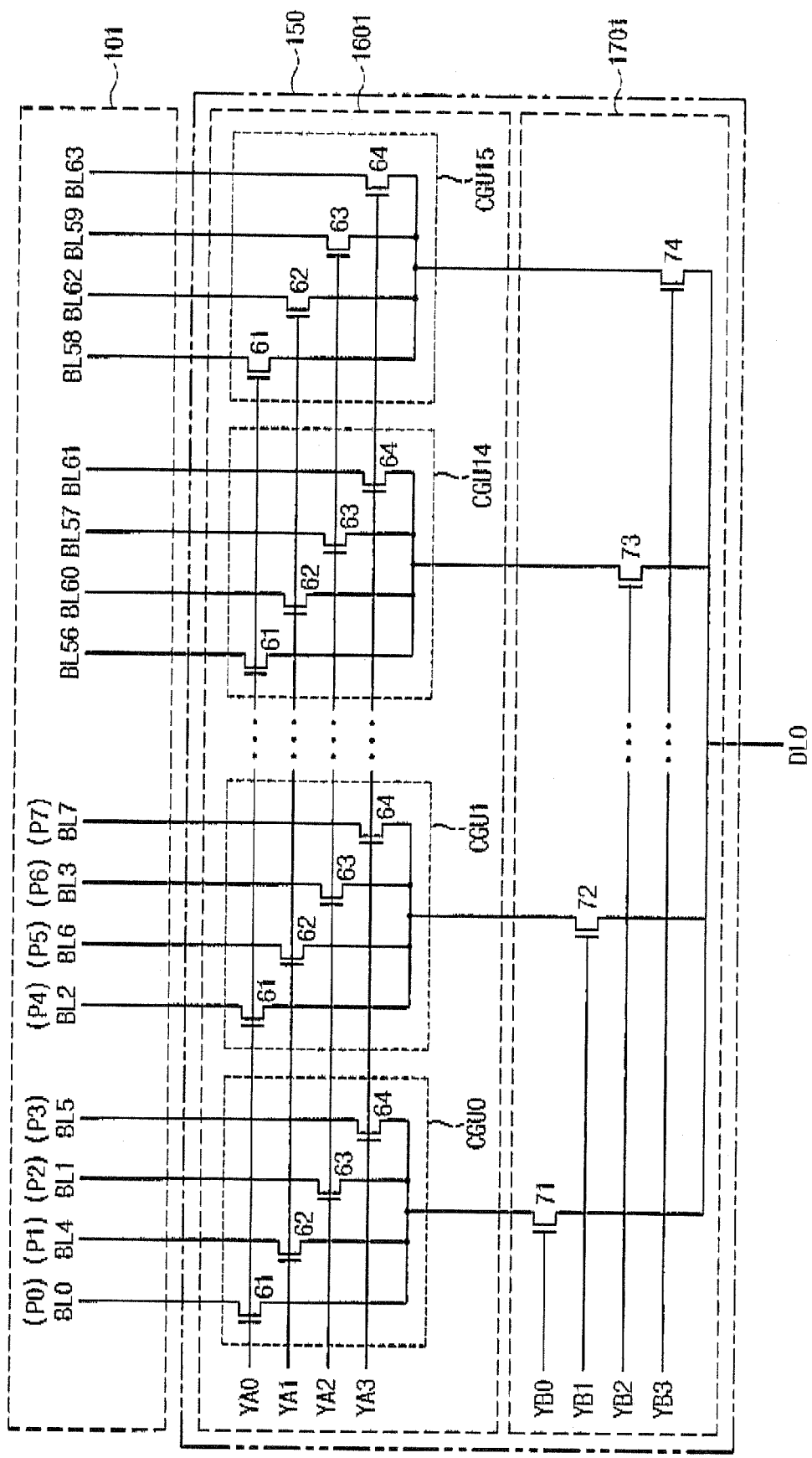
FIG. 3 is a circuit diagram illustrating an embodiment of a gate circuit belonging to one of a plurality of sectors shown in FIG. 2.

FIG. 3 is a circuit diagram illustrating a configuration of the gate circuit 150 belonging to one of the plural sectors 101~104 shown in FIG. 2. FIG. 3 shows one sector (e.g., 101) that includes 64 local bit lines BL0~BL63 and 16 global bit lines GBL0~GBL15.

Referring to FIG. 3, the gate circuit 1601 partially selects the local bit lines BL0~BL63 in response to the selection signals YA0~YA3 generated from the local column decoder 130. The gate circuit 160 includes pluralities of gate units CGU0~CGU15 corresponding to the global bit lines GBL0~GBL15. Each gate unit is composed of 4 NMOS transistors 61~64 that are coupled with the corresponding selection signals YA0~YA3.

Each of the gate units CGU0~CGU15 selects one of the 4 local bit lines in response to the selection signals YA0~YA3. For instance, the gate unit CGU0 selects one of the local bit lines BL0, BL4, BL1, and BL5 in response to the selection signals YA0~YA3. Here, it should be understood that while the local bit lines BL0, BL4, BL1, and BL5 connected to the gate unit CGU0 are physically successive to each other, they are logically discontinuous in arrangement. This is because logically successive column addresses are decoded into physically discontinuous column addresses.

P0, P1, P2, . . . , and P7, in FIG. 3, represent the physical column addresses corresponding to the bit lines. And BL0, BL4, BL1, BL5, . . . represent the logical column addresses corresponding to the bit lines. In this case, if the logical column addresses corresponding to the bit lines are 0, 1, 2, 3, . . . , the physical column addresses of the bit lines corresponding thereto are 0, 2, 4, 6, . . . . . If the logical column addresses corresponding to the bit lines are 0, 4, 1, 5, . . . , the physical column addresses of the bit lines corresponding thereto are 0, 1, 2, 3, . . . .

In FIG. 3, the physical column addresses corresponding to the bit lines, as well known by those skilled in this art, are defined as being arranged in the order of 0, 1, 2, 3, . . . from the left in accordance with physical positions of the bit lines. Therefore, to prevent confusion with the physical and logical column addresses corresponding to the bit lines, the present embodiment is described with reference to the logical column addresses corresponding to the bit lines.

The local bit lines BL0, BL4, BL1, and BL5 are not arranged in succession with the corresponding logical column addresses. Thus, activation of the local bit lines BL0, BL4, BL1, and BL5 is irrelevant to physical positions of the local bit lines BL0, BL4, BL1, and BL5. For example, after activating the local bit line BL0 during the burst read operation, the local bit line BL1, which is spaced from the local bit line BL0, is activated instead of the local bit line BL4 that is physically adjacent to the bit line BL0. Then, the local bit line BL2 physically apart from the active local bit line BL1 is activated. In this case, while the logical column addresses of the bit lines are sequentially regulated in activation, the bit lines physically adjacent to each other are non-sequentially controlled in activation. As a result, it effectively prevents the coupling effects between the bit lines physically adjacent to each other during the burst read operation, providing correct results of reading and enhancing an operating speed of reading.

Such a discontinuous activation scheme with the local bit lines adjacent to each other is applicable even to the global bit lines. For this scheme, the gate circuit 1701 is comprised of NMOS transistors 71~74 corresponding respectively to the gate units CGU0~CGU15. The NMOS transistors 71~74 are coupled with the selection signals YB0~YB3 corresponding thereto. The gate circuit 1701 connects the selected global bit lines GBL0~GBL15 to data lines DL0 in response to the selection signals YB0~YB3 generated from the global column decoder 140. Mapping patterns between the logical column addresses and the physical column addresses in correspondence with the global bit lines GBL0~GBL15 are determined by arrangement of the local bit lines corresponding thereto.

The aforementioned mapping patterns between the local bit lines BL0~BL63 and the decoded physical column addresses are determined in accordance with combinations (i.e., the decoding results by the local column decoder 130) of the selection signals YA0~YA3 substantially generated from the local column decoder 130. The mapping patterns between the global bit lines GBL0~GBL15 and the decoded physical column addresses are determined in accordance with combinations (i.e., the decoding results by the global column decoder 140) of the selection signals YB0~YB3 substantially generated from the global column decoder 140. Therefore, according to the decoding results by the local and global column decoders 130 and 140, disposition of the logical addresses for the local and global bit lines shown in FIG. 3 is modifiable or alterable in various patterns.

The aforementioned description is about a procedure of only decoding the bit lines. But, it can be understood by those skilled in the art that the bit lines are encoded corresponding to the decoding pattern, and data are written in the nonvolatile memory cells in accordance with the encoding results. Therefore, the present embodiment offers facilities of writing data with mapping the logical column addresses, which are successively generated in correspondence with adjacent bit lines, into the logical column addresses that are non-sequentially arranged, and then reading the written data.

According to the bit line decoding scheme, although the bit lines are physically adjacent to each other, the physically adjacent bit lines are non-sequentially activated because the logical column addresses corresponding to the bit lines are generated without adjacency. Thus, during the burst read operation, there is no coupling effect between adjacent bit lines, providing more accurate results of reading and also improving an operating speed of reading. These features of the present embodiment are accomplished by regulating the decoding scheme of the column decoder 120 without changing hardware architecture and interconnections.

In summary, coupling effects between the adjacent bit lines are effectively prevented without varying physical structures of the bit lines. As a result, operating speed and accuracy of the burst read operation in the nonvolatile memory device are improved.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

The invention claimed is:

1. A flash memory device comprising:
    a cell array including pluralities of memory cells coupled to pluralities of local bit lines;
    a first decoder configured to decode logically successive column addresses into physically discontinuous column addresses;
    a first gate circuit to partially select the bit lines in response to the decoded column addresses from the first decoder and couple the partially selected local bitlines to pluralities of global bit lines;
    a second decoder configured to decode logically successive column addresses into physically discontinuous column addresses; and
    a second gate circuit to partially select the global bit lines in response to the decoded column addresses from the second decoder.

2. The flash memory device as set forth in claim 1, wherein the flash memory device is a NOR flash memory device.

3. The flash memory device as set forth in claim 1, wherein physically adjacent bit lines are discontinuously selected during a burst read operation.

4. The flash memory device as set forth in claim 1, wherein the second gate circuit may couple the partially selected global bitlines to pluralities of data lines.

5. The flash memory device as set forth in claim 1, wherein physically adjacent global bit lines are discontinuously selected during a burst read operation.

6. The flash memory device as set forth in claim 1, wherein physically discontinuous column addresses comprise column addresses that are not accessed in sequence.

7. A flash memory device having a burst read mode wherein data is continuously read in response to addresses generated internally in sequence, the memory device comprising:
    a memory cell array having memory cells coupled to local bit lines;
    a gate circuit including a first gate block to couple selected ones of the local bit lines to global bit lines in response to local selection signals and a second gate block to couple selected ones of the global bit lines to sense amplifiers in response to global selection signals; and
    a column decoder including a local column decoder to generate the local selection signals and a global column decoder to generate the global selection signals in response to column addresses by decoding logically sequential column addresses into physical column addresses in an irregular sequence.

8. The memory device as set forth in claim 7 wherein local portions of logically successive column addresses are mapped to physically discontinuous local bit lines.

9. The memory device as set forth in claim 7 wherein global portions of logically successive column addresses are mapped to physically discontinuous global bit lines.

10. The memory device as set forth in claim 7, wherein the memory cell array is divided into sectors, and the gate circuit includes a gate block having a plurality of gate circuits corresponding to the sectors of the memory cell array and arranged to operate in response to the selection signals.

11. The memory device as set forth in claim 7, wherein the memory cell array is divided into sectors, and the gate circuit includes:
    a first gate block having a first plurality of gate circuits corresponding to the sectors of the memory cell array and arranged to operate in response to the local selection signals; and
    a second gate block having a second plurality of gate circuits corresponding to sectors of the memory cell array and arranged to operate in response to the global selection signals.

12. The memory device as set forth in claim 7, wherein decoding logically sequential column addresses into physical column addresses in an irregular sequence comprises decoding logically sequential column addresses into physical column addresses that are not in sequence.

* * * * *